(12) United States Patent  (10) Patent No.: US 7,696,670 B2
Sakamoto  (45) Date of Patent: Apr. 13, 2010

(54) ULTRASONIC MOTOR

(75) Inventor: Tetsuyuki Sakamoto, Tokyo (JP)

(73) Assignee: Olympus Corporation, Tokyo (JP)

( * ) Notice: Subject to any disclaimer, the term of this patent is extended or adjusted under 35 U.S.C. 154(b) by 84 days.

(21) Appl. No.: 12/136,330

(22) Filed: Jun. 10, 2008

(65) Prior Publication Data

US 2008/0303384 A1    Dec. 11, 2008

(30) Foreign Application Priority Data

Jun. 11, 2007    (JP)    ............................. 2007-154550

(51) Int. Cl.
*H02N 2/00*    (2006.01)
(52) U.S. Cl. .............................. 310/323.09; 310/323.02
(58) Field of Classification Search ............ 310/323.01, 310/323.02, 323.09, 323.16, 323.17
See application file for complete search history.

(56) References Cited

U.S. PATENT DOCUMENTS 6,104,123 A    8/2000    Okazaki et al.

| | | | |
|---|---|---|---|
| 2003/0015939 A1 | 1/2003 | Yamada | |
| 2004/0056564 A1* | 3/2004 | Iino et al. | .............. 310/323.02 |
| 2008/0174206 A1* | 7/2008 | Sakamoto | .............. 310/323.09 |

FOREIGN PATENT DOCUMENTS

JP    10-327589    12/1998

OTHER PUBLICATIONS

Extended European Search Report dated Dec. 29, 2009.

* cited by examiner

*Primary Examiner*—Thomas M Dougherty
(74) *Attorney, Agent, or Firm*—Scully, Scott, Murphy & Presser, P.C.

(57) ABSTRACT

An ultrasonic motor is provided with an ultrasonic transducer having a piezoelectric element, a holding member fixed to the ultrasonic transducer and holding the ultrasonic transducer, a pressing member pressing the holding member, and a member to be driven which is driven by frictional force between the member to be driven and the ultrasonic transducer. The pressing member has a hole portion and the holding member has a protruding portion engaged with the hole portion in a direction of pressing conducted by the pressing member. The hole portion and the protruding portion abut on each other so that the pressing member presses the member to be driven via the holding member and the ultrasonic transducer, thereby driving the member.

12 Claims, 4 Drawing Sheets

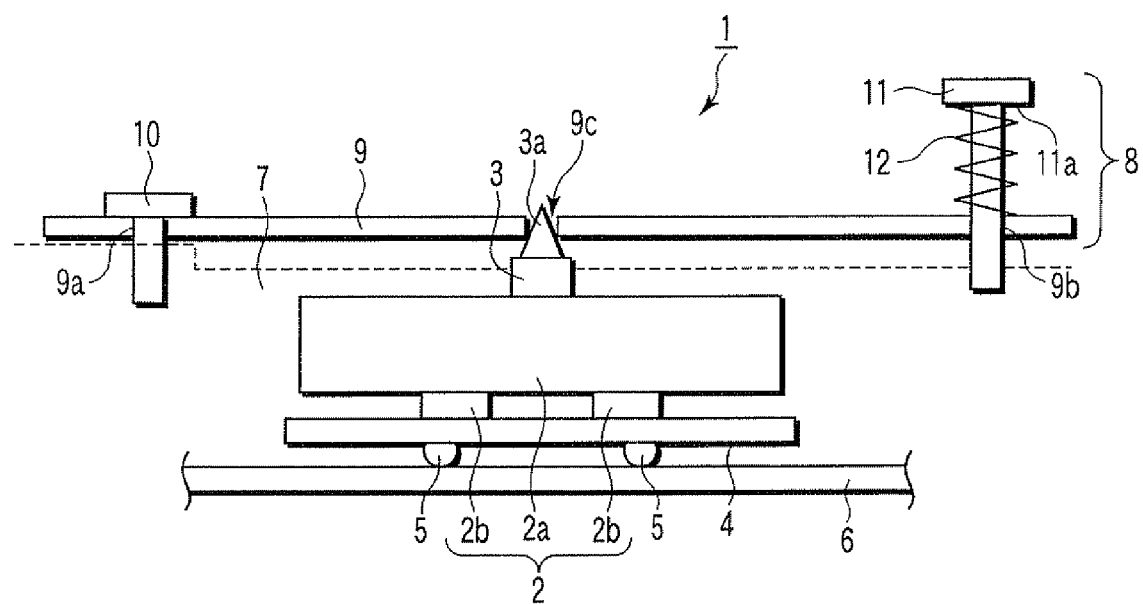
F I G. 1
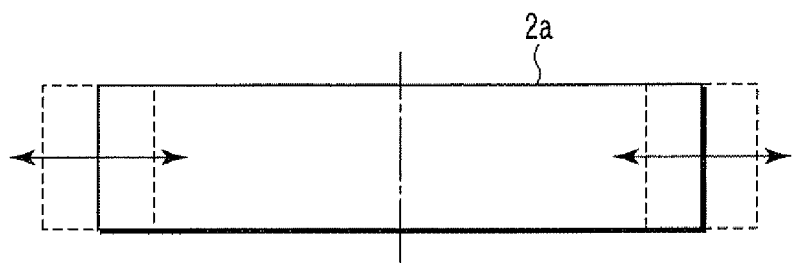
F I G. 2
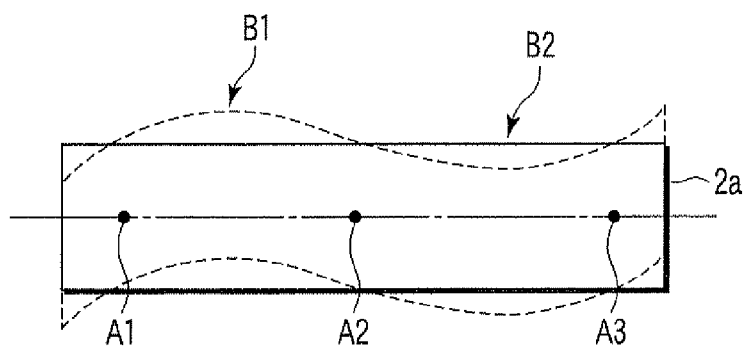
F I G. 3

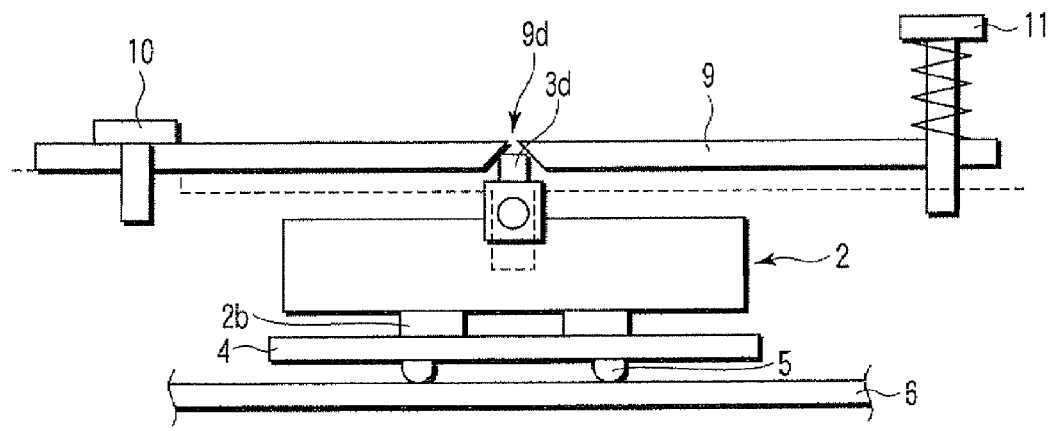
F I G. 7
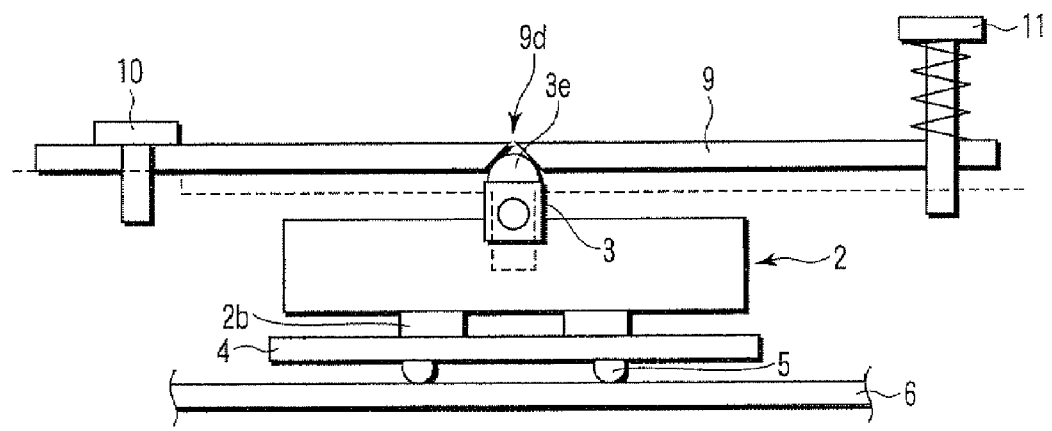
F I G. 8
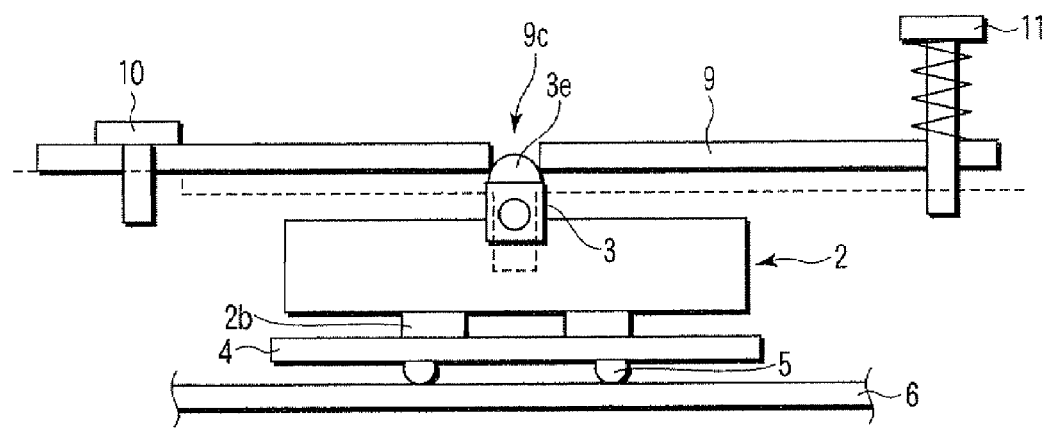
F I G. 9

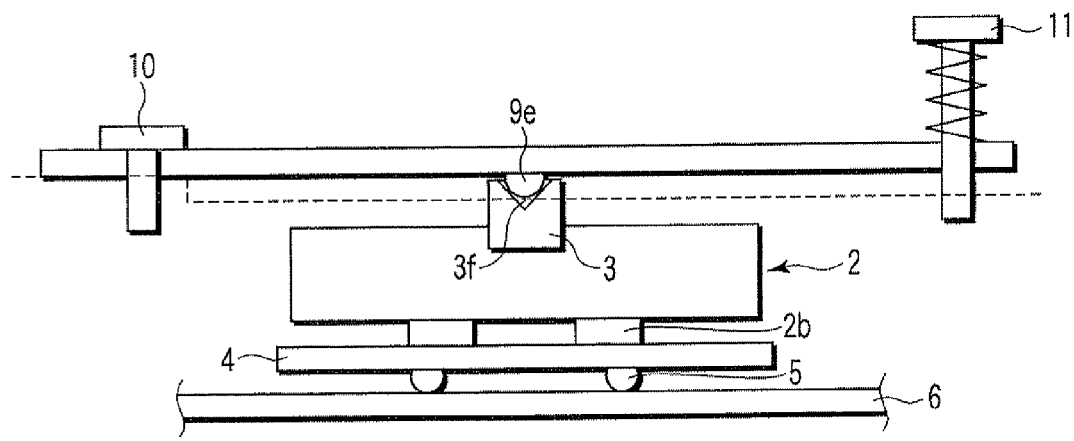
F I G. 10
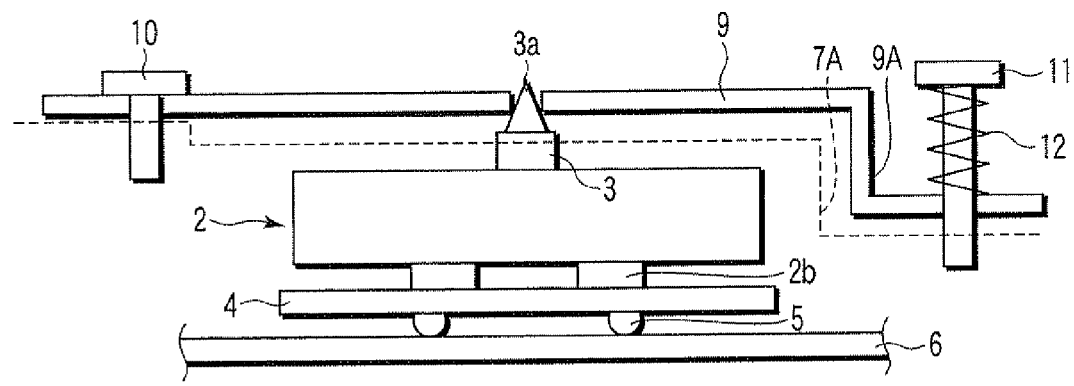
F I G. 11
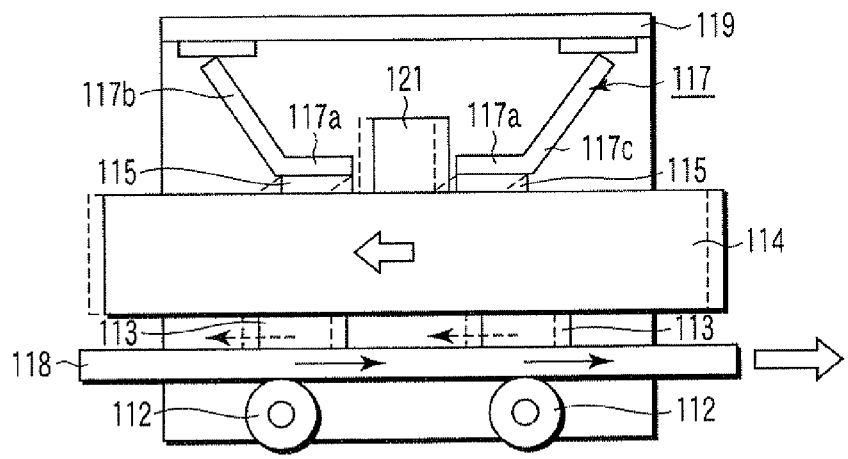
F I G. 12

ULTRASONIC MOTOR

CROSS-REFERENCE TO RELATED APPLICATIONS

This application is based upon and claims the benefit of priority from prior Japanese Patent Application No. 2007-154550, filed Jun. 11, 2007, the entire contents of which are incorporated herein by reference.

BACKGROUND OF THE INVENTION

1. Field of the Invention

The present invention relates to an ultrasonic motor.

2. Description of the Related Art

Currently, ultrasonic motors with a reduced size, a higher torque, a longer stroke, and a higher resolution as compared with those of an electromagnetic motor are widely used.

Presently, the ultrasonic motor is a motor for driving a member to be driven by frictional force generated between an ultrasonic transducer and the member to be driven by pressing the ultrasonic transducer on the member to be driven. As a pressing mechanism for pressing the ultrasonic transducer on the member to be driven, such a pressing mechanism as shown in FIG. 12 has been disclosed, for example, in JP-A-10-327589.

That is, in JP-A-10-327589, the pressing mechanism is provided with a transducer 114, protrusions 113 fixed on a lower portion of the transducer 114, a rail 118 serving as a movable member abutting on the protrusions 113, rotary members 112 contacting with a lower face of the rail 118 and guiding the rail 118, a spring member 117 caused to abut on an upper face of the transducer 114, a rubber sheet 115 disposed between the spring member 117 and the transducer 114, a columnar retainer 121 extending through the spring member 117 and the rubber sheet 115 to be fixed to the transducer 114, and a fixing member 119 pressing the spring member 117.

More specifically, the spring member 117 is provided with a flat face portion 117a contacting with the rubber sheet 115 and flat face portions 117b and 117c formed to extend from both ends of the flat face portion 117a symmetrically regarding the flat face portion 117a. Distal end portions of the flat face portion 117b and the flat face portion 117c are pressed down by the fixing member 119 so that portions of the spring member 117 in the vicinities of boundary lines between the flat face portion 117a, and the flat face portions 117b and 117c are deformed. Thereby, the flat face portion 117a is pressed downwardly (in a direction of the transducer 114).

In the pressing mechanism disclosed in JP-A-10-327589, a pressing force for pressing the transducer 114 (the protrusions 113) on the rail 118, which is the member to be driven, is generated according to such a structure as described above.

A rectangular through-hole portion (not shown) is provided in the flat face portion 117a of the spring member 117. Further, a similar rectangular through-hole portion (not shown) is provided in the rubber sheet 115 provided so as to be sandwiched between the spring member 117 and the transducer 114. The columnar retainer 121 extends through the rectangular through-holes (not shown) provided on both the spring member 117 and the rubber sheet 115 to be fixed to the transducer 114.

The columnar retainer 121 is provided such that side face portions thereof are surrounded by sections of the through-hole portions (not shown) of the spring member 117 and the rubber sheet 115. The position of the transducer 114 within a plane thereof contacting with the rubber sheet 115 is restricted by the structure.

BRIEF SUMMARY OF THE INVENTION

In view of these circumstances, the present invention has been made and an object thereof is to provide an ultrasonic motor where a transducer can finely and stably drive a member to be driven.

In order to achieve the object, according to a first aspect of the present invention, there is provided an ultrasonic motor comprising an ultrasonic transducer having a piezoelectric element; a holding member which is fixed to the ultrasonic transducer and holds the ultrasonic transducer; a pressing member which presses the holding member; and a member to be driven which is driven by frictional force between the member to be driven and the ultrasonic transducer, wherein the pressing member has a hole portion, the holding member has a protruding portion engaged with the hole portion in a direction of pressing conducted by the pressing member, and the hole portion and the protruding portion abut on each other so that the pressing member presses the member to be driven via the holding member and the ultrasonic transducer, thereby driving the member to be driven.

In order to achieve the object, according to a second aspect of the present invention, there is provided an ultrasonic motor comprising an ultrasonic transducer having a piezoelectric element; a holding member which is fixed to the ultrasonic transducer and holds the ultrasonic transducer; a pressing member which presses the holding member; and a member to be driven which is driven by the frictional force between the member to be driven and the ultrasonic transducer, wherein the holding member has a hole portion, the pressing member has a protruding portion engaged with the hole portion in a direction of pressing conducted by the pressing member so that the hole portion and the protruding portion abut on each other so that the pressing member presses the member to be driven via the holding member and the ultrasonic transducer, thereby driving the member to be driven.

According to the present invention, the ultrasonic motor in which a fine driving operation for stably driving a member to be driven can be provided.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional schematic view showing a configuration of an ultrasonic motor according to a first embodiment of the present invention;

FIG. 2 is a diagram showing longitudinal vibration of a piezoelectric laminated body;

FIG. 3 is a diagram showing bending vibration of the piezoelectric laminated body;

FIG. 7 is a sectional schematic view showing a configuration of an ultrasonic motor according to a third embodiment of the present invention;

FIG. 8 is a sectional schematic view showing a configuration of an ultrasonic motor according to a fourth embodiment of the present invention;

FIG. 9 is a sectional schematic view showing a configuration of an ultrasonic motor according to a first modification of the fourth embodiment of the present invention;

FIG. 10 is a sectional schematic view showing a configuration of an ultrasonic motor according to a second modification of the fourth embodiment of the present invention;

FIG. 11 is a sectional schematic view showing a configuration of an ultrasonic motor according to a fifth embodiment of the present invention; and FIG. 12 is a diagram showing a conventional pressing mechanism for pressing an ultrasonic transducer to a member to be driven.

DETAILED DESCRIPTION OF THE INVENTION

Figure 4:
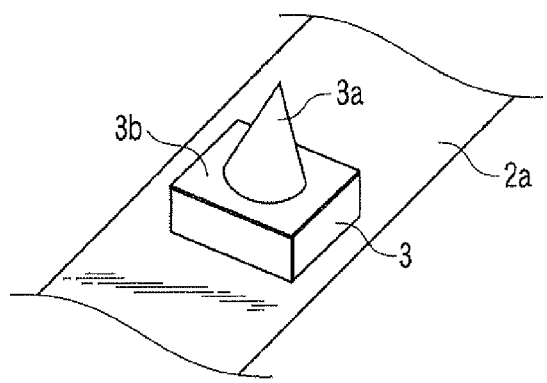
FIG. 4 is a perspective view showing shapes of the piezoelectric laminated body and a holding member.

Ultrasonic motors according to embodiments of the present invention will be explained below with reference to the drawings.

First Embodiment

FIG. 1 is a sectional schematic view showing a configuration of an ultrasonic motor according to a first embodiment of the present invention. As shown in FIG. 1, an ultrasonic motor 1 according to the first embodiment is provided with an ultrasonic transducer 2, a holding member 3 holding the ultrasonic transducer 2, a member to be driven 4 which is brought in contact with the ultrasonic transducer 2 to be driven relative to the ultrasonic transducer 2, rolling members 5 disposed between the member to be driven 4 and a casing 6, a casing 7, and a pressing mechanism 8 which presses the ultrasonic transducer 2 to the member to be driven 4. Incidentally, though described later in detail, the pressing mechanism 8 includes a pressing member 9, a fixing screw member 10, a screw member for press adjustment 11, and a helical coil spring 12.

The ultrasonic transducer 2 includes a rectangular parallelepiped piezoelectric laminated body 2a obtained by laminating a plurality of sheet-like internal electrodes on one side face of a rectangular plate-like piezoelectric ceramic sheet and two friction contacts (hereinafter, referred to as "driving element") 2b which are bonded to one side face of the piezoelectric laminated body 2a and brought in close contact with the member to be driven 4.

In the piezoelectric laminated body 2a, longitudinal vibration shown in FIG. 2 and second-order bending vibration shown in FIG. 3 are excited by applying an alternating voltage with a predetermined pattern to the internal electrodes. Especially, the second-order bending vibration is provided with nodes A1, A2, and A3 of a standing wave spaced from one another in a longitudinal direction of the piezoelectric laminated body 2a at three points, as shown in FIG. 3. An anti-node B1 of standing wave of the vibration is formed between the node A1 and the node A2, and an anti-node B2 of standing wave of the vibration is formed between the node A2 and the node A3.

The piezoelectric laminated body 2a is fixed to the holding member 3 at a position corresponding to the node A2 of a standing wave of the longitudinal vibration and the bending vibration by an adhesive or the like. The driving elements 2b, each being formed in a block shape rectangular parallelepiped, are fixed at portions of the ultrasonic transducer 2 corresponding to the anti-nodes B1 and B2 of the second-order bending vibration by an adhesive or the like.

Incidentally, the holding member 3 is formed in a rectangular parallelepiped shape, and is provided by being bonded onto an upper face of the piezoelectric laminated body 2a of the ultrasonic transducer 2 by an adhesive or the like, as shown in FIG. 4, which is a perspective view corresponding to a case where the piezoelectric laminated body 2a and the holding member 3 are viewed obliquely from above. Here, the holding member 3 is provided on its upper face plate portion 3b with a conical projecting portion which is a conical protrusion portion.

The rolling members 5 are each formed in a spherical shape, and they are fitted and held in a groove or the like provided on a face of the member to be driven 4 facing the casing 6. Any displacement of the member to be driven 4 in a moving direction thereof is restricted by, for example, a retainer (not shown) or the like. With such a configuration, it becomes possible to drive the member to be driven 4 relative to the ultrasonic transducer 2 and the casing 6.

Incidentally, of course, a member for guiding the rolling members 5 (for example, a groove, a rail, or the like) may be provided on the casing 6.

The pressing member 9 is a flat plate, and one end portion thereof is formed with a hole portion 9a allowing penetration of the fixing screw member 10, while the other end portion thereof is formed with a hole portion 9b for allowing penetration of the screw member for press adjustment 11 for adjusting press of the pressing member 9. Further, a circular hole portion 9c with a diameter slightly smaller than a diameter of a bottom face of the conical protruding portion 3a provided on the holding member 3 is formed on a central portion of the pressing member 9.

An assembling method of the ultrasonic motor 1 according to the first embodiment will be explained below. Incidentally, the casing 6 is preliminarily fixed to the casing 7 by using such means as a screw or the like.

First, a retainer (not shown) is placed on the casing 6 and the rolling members 5 are placed on a holding portion in the retainer (not shown).

Subsequently, the member to be driven 4 is placed on the rolling members 5 and the ultrasonic transducer 2 is placed on the member to be driven 4 such that the driving elements 2b of the ultrasonic transducer 2 are brought in close contact with an upper face of the member to be driven 4.

Next, the pressing member 9 is placed on an upper face of the casing 7 from above the ultrasonic transducer 2. At this time, the conical protruding portion 3a of the holding member 3 is inserted into the circular hole portion 9c provided at the central portion of the pressing member 9 so that a conical face of the conical protruding portion 3a abuts on an inner periphery (a ridge line of the hole) of the circular hole portion 9c without any clearance therebetween.

Thereby, a position of the central portion of the pressing member 9 is restricted regarding a pressing direction. At this time, a relative position of the pressing member 9 and the casing 7 to each other are set such that slight clearances are formed between both end portions of the pressing member 9 and an upper face of the casing 7.

Thereafter, the fixing screw member 10 is inserted through the hole portion 9a of the pressing member 9 to be fastened to the casing 7. Thereby, the position of the pressing member 9 in the longitudinal direction of the ultrasonic transducer 2 is fixed. Therefore, the position of the holding member 3 is also restricted.

The screw member for press adjustment 11 is inserted through the hole portion 9b of the pressing member 9 to be screwed to a screw hole of the casing 7. At this time, the helical coil spring 12 is assembled in a state that it is sandwiched between an upper face of the pressing member 9 and a lower face 11a of a screw head of the screw member for press adjustment 11 (which may be a washer). Thereby, the helical coil spring 12 is compressed according to fastening work of the screw member for press adjustment 11 so that a repelling force acts on the upper face of the pressing member 9.

Now, as described above, one end of the pressing member 9 is fixed to the casing 7 by the fixing screw member 10, and the other end thereof is pressed, utilizing the fixed end of the pressing member 9 as a fulcrum, so that pressing force acts on the holding member 3 through the circular hole portion 9c at the central portion of the pressing member 9 and the conical protrusion portion 3a. Thereby, a pressing force whereby the ultrasonic transducer 2 is pressed on the member to be driven 4 is generated.

By adjusting a fastening amount of the screw member for press adjustment 11, a compression amount of the helical coil spring 12 can be adjusted. Accordingly, the pressing mechanism mentioned above is a pressing mechanism whose pressing force can be adjusted.

As explained above, according to the ultrasonic motor according to the first embodiment, an ultrasonic motor where the ultrasonic transducer 2 can finely and stably drive the member to be driven 4 can be provided.

That is, according to the ultrasonic motor according to the first embodiment, even while the member to be driven 4 is being driven by the frictional force caused by vibration of the ultrasonic transducer 2, positional deviation of the ultrasonic transducer 2 does not occur. Therefore, a stable drive amount can be obtained in precise drive of the member to be driven 4. The ultrasonic motor according to the first embodiment can be said to be an ultrasonic motor which can be assembled easily and is inexpensive and which is provided with precise driving characteristics.

More specifically, the ultrasonic motor according to the first embodiment can achieve the following effects.

First, the conical protrusion portion 3a of the holding member 3 abuts on the circular hole portion 9c of the pressing member 9 without any clearance therebetween so that the ultrasonic transducer 2 is held. Here, the pressing member 9 is fixed to the casing 7 by the fixing screw member 10.

By adopting such a structure, even when the member to be driven 4 is driven by frictional force due to vibration of the ultrasonic transducer 2, positional deviation of the ultrasonic transducer 2 does not occur. Accordingly, a stable drive amount can be obtained when the member to be driven 4 is driven finely.

Further, the ultrasonic motor according to the first embodiment has such a merit that it can be assembled easily as compared with a conventional ultrasonic motor.

For example, JP-A-10-327589 does not include any disclosure about an assembling method and a fixing method of the pressing mechanism. In assembling the pressing mechanism (see FIG. 12), it is necessary to dispose the spring member 117 between the transducer 114 and the fixing member 119 while the flat face portions 117b and 117c of the spring member 117 are being deformed by pressing the flat face portions 117b and 117c from their natural states thereof downwardly. Incidentally, when the fixing member 119 is assembled in advance, such an assembling method must be adopted that the spring member 117 is inserted into a clearance between the transducer 114 and the fixing member 119 while the spring member 117 is being deformed and the rectangular through-hole portion is inserted into columnar retainer 121 fixed to the transducer 114 in advance. However, such an assembling method is not a realistic method.

That is, when the pressing mechanism disclosed in JP-A-10-327589 is assembled, such an assembling method is adopted that, after the rubber sheet 115 and the spring member 117 are placed on the transducer 114 by inserting the columnar retainer 121 into the rectangular hole portions provided in the rubber sheet 115 and the spring member 117, the fixing member 119 is attached. Such an assembling work must be conducted that the distal end portions of the flat face portions 117b and 117c of the spring member 117 are caused to abut on the fixing member 119 and the fixing member 119 is coupled to a guide member (not shown) while it is being pressed down, which will result in much difficult work.

On the other hand, in assembling the ultrasonic motor according to the first embodiment, as described above, only such a simple work is required that respective parts are placed sequentially and fixation is finally performed by fastening utilizing the fixing screw member 10 and the screw member for press adjustment 11 or the like. That is, placements and fastenings of respective parts can be performed solely from one direction. That is, the ultrasonic motor according to the first embodiment is excellent in ease of assembly.

Incidentally, the driving element 2b is made of, for example, a composite resin material obtained by filling a filler of potassium titanate into the base of PPS (polyphenylene sulfide), which is heat resistant thermoplastic resin, in an amount of 20 to 30% wt and further mixing carbon fiber and PTFE (polytetrafluoroethylene) therein.

The member to be driven 4 is made from, for example, magnesium silicate ($2MgO.SiO_2$) containing therein iron, and a face thereof contacting with the driving element 2b is subjected to lapping such that a surface roughness thereof Ra becomes 0.2 μm or less.

In order to transmit vibration of the piezoelectric laminated body 2a to the member to be driven 4 securely without causing damping of the vibration, for example, the height of the driving element 2b is set to a height of 0.7 mm or less from an end face of the piezoelectric laminated body 2a. Incidentally, it is preferable that the height is 0.4 mm.

Second Embodiment

An ultrasonic motor according to a second embodiment of the present invention will be explained below with reference to FIGS. 5 and 6. Incidentally, in order to focus on a feature portion of the ultrasonic motor according to the second embodiment, only a different point from the ultrasonic motor according to the first embodiment will be explained.

Figure 5:
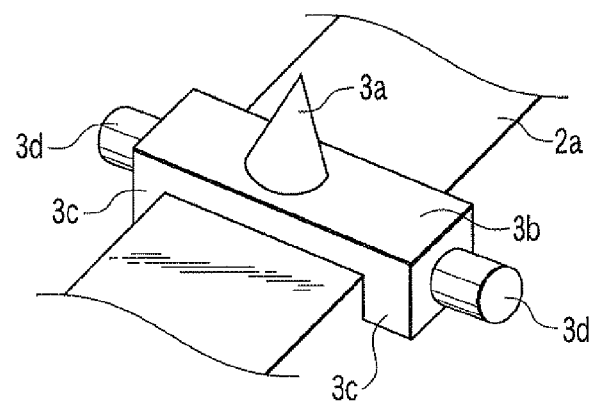
FIG. 5 is a perspective view showing a shape of a holding member in an ultrasonic motor according to a second embodiment of the present invention.
Figure 6:
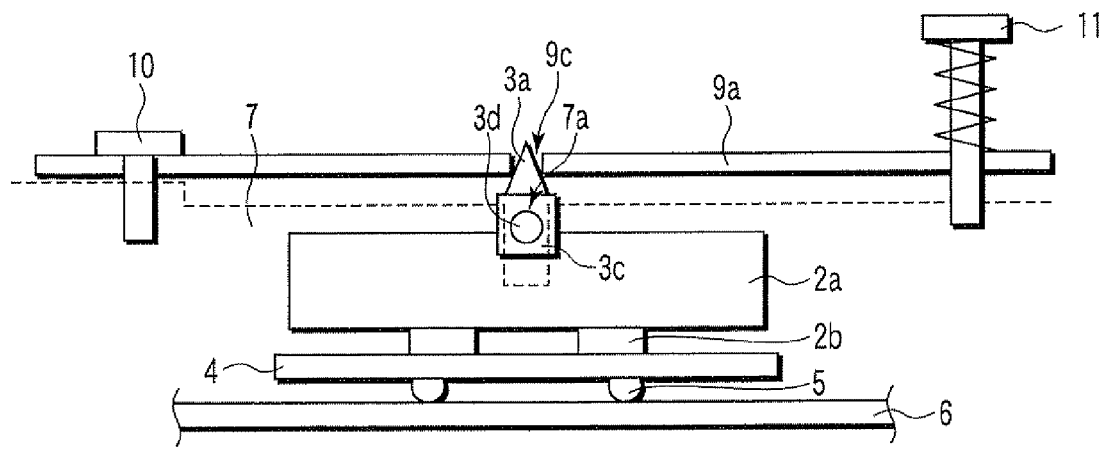
FIG. 6 is a sectional schematic view showing a configuration of the ultrasonic motor according to the second embodiment of the present invention.

In the second embodiment, the holding member 3 is configured as shown in FIGS. 5 and 6. FIG. 5 is a perspective view showing a shape of the holding member 3 in the ultrasonic motor according to the second embodiment. FIG. 6 is a sectional schematic view showing a configuration of the ultrasonic motor according to the second embodiment.

That is, the holding member 3 according to the second embodiment is configured such that both ends of an upper flat plate portion 3b are equally protruded to both sides of the piezoelectric laminated body 2 in a thickness direction (a lamination direction) thereof and two side face flat plate portions 3c brought in close contact with side face portions of the piezoelectric laminated body 2a are provided on both protruded end portions. Further, columnar protrusion portions 3d, each being a columnar protrusion portion projecting in a thickness direction of the piezoelectric laminated body 2a, are provided on the two side face flat plate portions 3c. The conical protruding portion 3a is provided on the upper face flat plate portion 3b like the first embodiment.

On the other hand, the casing 7 is formed with a groove portion 7a having a diameter slightly larger than a diameter of the columnar protrusion portion 3d. Incidentally, the other members in the second embodiment are the same as those explained in the first embodiment.

In the ultrasonic motor 1 with the abovementioned configuration, the columnar protrusion portions 3d of the holding member 3 bonded to the ultrasonic transducer 2 are inserted into the groove portion 7a of the casing 7 and guided thereby. Thereby, a rough position of the ultrasonic transducer 2 in the longitudinal direction is determined.

Incidentally, a position where the groove portion 7a should be provided is determined on the casing 7 such that, when the pressing member 9 is fixed to the casing 7, the circular hole portion 9c in the pressing member 9 is positioned just above the conical protruding portion 3a of the holding member 3. Thereby, such an effect that the ultrasonic motor can be assembled easily can be obtained.

Here, in the second embodiment, the groove portion 7a of the casing 7 only serves as a guide mechanism. Accordingly, the holding mechanism is similar to that in the first embodiment. That is, such a configuration is adopted that the circular hole portion 9c in the pressing member 9 and the conical protrusion portion 3a of the holding member abut on each other without forming any clearance so that the ultrasonic transducer 2 is held.

As explained above, according to the second embodiment, positional deviation of the ultrasonic transducer 2 does not occur while the ultrasonic transducer 2 is driving the member to be driven 4, like the first embodiment. Therefore, an ultrasonic motor which can finely and stably drive a member to be driven 4 can be provided.

Third Embodiment

An ultrasonic motor according to a third embodiment of the present invention will be explained below with reference to FIG. 7. FIG. 7 is a sectional schematic view showing a configuration of an ultrasonic motor according to the third embodiment of the present invention. Incidentally, in order to focus on a feature portion of the ultrasonic motor according to the third embodiment, only a different point from the ultrasonic motor according to the second embodiment will be explained.

In the third embodiment, regarding the holding member 3, a columnar protrusion portion 3d instead of the conical protrusion portion 3a is provided on the upper face flat plate portion 3b.

A tapered hole portion 9d formed in a central portion of the pressing member 9 is formed as a tapered hole (whose diameter is gradually reduced to a diameter smaller than the diameter of the columnar protrusion portion 3d) such that its diameter on one face, which is a face facing the ultrasonic transducer 2, is larger than a diameter of a column of the columnar protrusion portion 3d while the diameter of the tapered hole portion 9d is reduced according to proximity to the other face, which is a face on the opposite side to the one face.

More specifically, the tapered hole portion 9d formed as such a tapered hole is formed such that an approximately conical face (a ridge line of the hole) of an inner periphery thereof abuts on the columnar protruding portion 3d of the holding member 3 and the ultrasonic transducer 2 is held, as shown in FIG. 7.

Incidentally, in the first embodiment and the second embodiment, the inner periphery (the ridge line of the hole) of the circular hole portion 9c and the conical face of the conical protrusion portion 3a abut on each other so that the ultrasonic transducer 2 is held.

With the structure such as described above, in the third embodiment, the ultrasonic transducer 2 can be held without causing positional deviation thereof, like the first embodiment and the second embodiment.

As explained above, an ultrasonic motor which can achieve an effect similar to that obtained by the ultrasonic motors according to the first embodiment and the second embodiment can be provided according to the third embodiment.

Fourth Embodiment

An ultrasonic motor according to a fourth embodiment of the present invention will be explained below with reference to FIG. 8. FIG. 8 is a sectional schematic view showing a configuration of an ultrasonic motor according to the fourth embodiment of the present invention. Incidentally, in order to focus on a feature portion of the ultrasonic motor according to the fourth embodiment, only a different point from the ultrasonic motor according to the third embodiment will be explained.

In the fourth embodiment, the holding member 3 is provided with a hemispherical protruding portion 3e (which is a hemispherical protrusion portion) bonded and fixed on the upper face flat plate portion 3b, for example.

On the other hand, the tapered hole portion 9d described above is formed at a central portion of the pressing member 9, like the ultrasonic motor according to the third embodiment.

As shown in FIG. 8, the tapered hole portion 9d is formed such that an approximately conical face (a ridge line of the hole) of an inner periphery thereof abuts on the hemispherical protruding portion 3e of the holding member 3 so that ultrasonic transducer 2 is held.

With a structure such as described above, in the fourth embodiment, the ultrasonic transducer 2 can be held without causing positional deviation thereof, like the first embodiment to the third embodiment.

As explained above, according to the fourth embodiment, an ultrasonic motor which can achieve an effect similar to that obtained by the ultrasonic motors according to the first embodiment to the third embodiment can be provided according to the fourth embodiment.

Incidentally, regarding the ultrasonic motor according to the fourth embodiment, for example, the following modifications can be proposed.

[First Modification]

For example, as shown in FIG. 9, a circular hole portion 9c whose diameter is constant may be formed instead of the tapered hole portion 9d formed in the pressing member 9. Incidentally, a diameter of the circular hole portion 9c is such a diameter that an inner periphery (the ridge line of the hole)

of the circular hole portion 9c and the hemispherical protrusion portion 3e provided on the holding member 3 abut on each other.

In this case, the inner periphery (the ridge line of the hole) of the circular hole portion 9c and the hemispherical protruding portion 3e abut on each other so that the ultrasonic transducer 2 is held. That is, with such a structure as described above, the ultrasonic transducer 2 can be held without causing positional deviation in the first modification.

As explained above, an ultrasonic motor which can achieve an effect similar to that obtained by the ultrasonic motor according to the fourth embodiment can be obtained according to the first modification.

[Second Modification]

Further, the following modification can be proposed.

That is, as shown in FIG. 10, the hemispherical protruding portion 9e instead of the hole portion is provided at a central portion on the pressing member 9 so as to face the ultrasonic transducer 2. Incidentally, the protrusion portion 9e may be a hemispherical member provided as a member separated from the pressing member 9 and fixed to the pressing member 9, for example, by using an adhesive or it may be provided by protruding a central portion of the pressing member 9 in a hemispherical manner by a drawing work or the like. On the other hand, a conical hole portion 3f, which is a conical hole portion, is provided in the holding member 3.

More specifically, as shown in FIG. 10, the conical hole portion 3f and the protruding portion 9e are formed such that a conical face (a ridge line of the hole) of an inner periphery of the conical hole portion 3f provided in the holding member 3 abuts on the protruding portion 9e provided on the pressing member 9 so that the ultrasonic transducer 2 is held.

With such a structure as described above, in the second modification, the ultrasonic transducer 2 can be held without causing positional deviation, like the fourth embodiment.

With such a structure, the hemispherical protruding portion 9e provided on the pressing member 9 abuts on the conical hole portion 3f provided in the holding member 3 so that ultrasonic transducer 2 is held.

As explained above, according to the second modification, an ultrasonic motor which can achieve an effect similar to that obtained by the ultrasonic motor according to the fourth embodiment can be provided.

Fifth Embodiment

An ultrasonic motor according to a fifth embodiment of the present invention will be explained below with reference to FIG. 11. Incidentally, in order to focus on a feature portion of the ultrasonic motor according to the fifth embodiment, only a different point from the ultrasonic motor according to the first embodiment will be explained.

In the fifth embodiment, as shown in FIG. 11, a region of the pressing member 9 positioned near a portion thereof penetrated by the screw member for press adjustment 11 is bent in a crank shape. In other words, as shown in FIG. 11, the pressing member 9 is provided with a bent structure 9A formed in a crank shape in the region thereof near the portion thereof penetrated by the screw member for press adjustment 11.

The casing 7 is also provided with a stepped structure 7A corresponding to the crank shape of the pressing member 9 so as to correspond to the pressing member 9 with such a shape.

In the fifth embodiment, the helical coil spring 12 and the screw member for press adjustment 11 are accommodated in a region formed by providing the stepped structure 7A and the bent structure 9A, namely, a region recess in the pressing direction by the pressing member 9. Therefore, space saving for part arrangement in the pressing direction can be realized.

Incidentally, the fifth embodiment can be applied to any one of the first embodiment to the fourth embodiment, of course.

As explained above, according to the fifth embodiment, an effect similar to that obtained by the first embodiment can be achieved and an ultrasonic motor which can achieve space saving can be provided.

Though the present invention has been explained above based upon the first embodiment to fifth embodiment, the present invention is not limited to the abovementioned embodiments and it may be modified and applied variously within the scope of the gist of the present invention.

Further, inventions in various stages are contained in the abovementioned embodiments, and various inventions can be extracted according to proper combinations of a plurality of constituent elements disclosed here. For example, even if some of the constituent elements are removed from all the constituent elements disclosed in the embodiments, when the problem described in Paragraph "BRIEF SUMMARY OF THE INVENTION" can be solved and an effect described in Paragraph "BRIEF SUMMARY OF THE INVENTION" can be obtained, the configuration where some constituent elements have been removed can also be extracted as an invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic motor comprising:
   an ultrasonic transducer having a piezoelectric element;
   a holding member which is fixed to the ultrasonic transducer and holds the ultrasonic transducer;
   a pressing member which presses the holding member; and
   a member to be driven which is driven by frictional force between the member to be driven and the ultrasonic transducer, wherein
   the pressing member has a hole portion, the holding member has a protruding portion engaged with the hole portion in a direction of pressing conducted by the pressing member,
   and the hole portion and the protruding portion abut on each other so that the pressing member presses the member to be driven via the holding member and the ultrasonic transducer, thereby driving the member to be driven.

2. The ultrasonic motor according to claim 1, wherein the protrusion portion is conical or hemispherical, and the hole portion is a circular hole.

3. The ultrasonic motor according to claim 1, wherein the protruding portion is conical or hemispherical, and the hole portion is a conical opening or a conical recess.

4. An ultrasonic motor comprising:
   an ultrasonic transducer having a piezoelectric element;
   a holding member which is fixed to the ultrasonic transducer and holds the ultrasonic transducer;
   a pressing member which presses the holding member; and
   a member to be driven which is driven by frictional force between the member to be driven and the ultrasonic transducer, wherein the holding member has a hole portion, the pressing member has a protruding portion engaged with the hole portion in a direction of pressing conducted by the pressing member, and the hole portion and the protruding portion abut on each other so that the pressing member presses the member to be driven via the holding member and the ultrasonic transducer, thereby driving the member to be driven.

5. The ultrasonic motor according to claim 4, wherein the protruding portion is conical or hemispherical, and the hole portion is a circular hole.

6. The ultrasonic motor according to claim 4, wherein the protruding portion is conical or hemispherical, and the hole portion is a conical opening or a conical recess.

7. The ultrasonic motor according to claim 1, wherein the pressing member is fixed to a casing of the ultrasonic motor at least one portion, and the pressing member is pressed to the casing of the ultrasonic motor at least one portion.

8. The ultrasonic motor according to claim 2, wherein the pressing member is fixed to a casing of the ultrasonic motor at least one portion, and the pressing member is pressed to the casing of the ultrasonic motor at least one portion.

9. The ultrasonic motor according to claim 3, wherein the pressing member is fixed to a casing of the ultrasonic motor at least one portion, and the pressing member is pressed to the casing of the ultrasonic motor at least one portion.

10. The ultrasonic motor according to claim 4, wherein the pressing member is fixed to a casing of the ultrasonic motor at least one portion, and the pressing member is pressed to the casing of the ultrasonic motor at least one portion.

11. The ultrasonic motor according to claim 5, wherein the pressing member is fixed to a casing of the ultrasonic motor at least one portion, and the pressing member is pressed to the casing of the ultrasonic motor at least one portion.

12. The ultrasonic motor according to claim 6, wherein the pressing member is fixed to a casing of the ultrasonic motor at least one portion, and the pressing member is pressed to the casing of the ultrasonic motor at least one portion.

* * * * *